United States Patent
Renard et al.

(10) Patent No.: US 10,347,786 B2
(45) Date of Patent: Jul. 9, 2019

(54) OPTICAL SENSOR PACKAGE INCLUDING A CAVITY FORMED IN AN IMAGE SENSOR DIE

(71) Applicant: STMICROELECTRONICS PTE LTD, Singapore (SG)

(72) Inventors: Loic Pierre Louis Renard, Singapore (SG); Cheng-Lay Ang, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 0 days.

(21) Appl. No.: 15/880,090

(22) Filed: Jan. 25, 2018

(65) Prior Publication Data

US 2018/0151772 A1   May 31, 2018

Related U.S. Application Data

(63) Continuation of application No. 15/199,390, filed on Jun. 30, 2016, now Pat. No. 9,911,890.

(51) Int. Cl.
| | |
|---|---|
| *H01G 9/20* | (2006.01) |
| *G01S 17/08* | (2006.01) |
| *G01S 7/481* | (2006.01) |
| *H01L 31/12* | (2006.01) |
| *H01S 5/022* | (2006.01) |
| *H01S 5/183* | (2006.01) |

(Continued)

(52) U.S. Cl.
CPC .......... *H01L 31/173* (2013.01); *G01S 7/4813* (2013.01); *G01S 17/08* (2013.01); *H01G 9/20* (2013.01); *H01L 31/0203* (2013.01); *H01L 31/02366* (2013.01); *H01L 31/042* (2013.01); *H01L 31/046* (2014.12); *H01L 31/047* (2014.12); *H01L 31/0475* (2014.12); *H01L 31/125* (2013.01); *H01S 5/02252* (2013.01); *H01S 5/183* (2013.01); *Y02E 10/50* (2013.01)

(58) Field of Classification Search
CPC ... H01L 31/173; H01L 31/125; H01L 31/042; H01L 31/046; H01L 31/047; H01L 31/0475; H01L 27/156; H01L 27/3293; H01L 27/14643; H01S 5/183; H01S 5/02252; H01G 9/20
USPC ......... 257/80, 81, 82, 84, E31.095, E31.117, 257/E31.121; 438/25; 250/239
See application file for complete search history.

(56) References Cited

U.S. PATENT DOCUMENTS

| | | | | |
|---|---|---|---|---|
| 8,362,496 B1 * | 1/2013 | Tu | ........... | H01L 25/167 257/80 |
| 8,822,925 B1 * | 9/2014 | Patel | ........ | H01L 25/50 250/338.1 |

(Continued)

*Primary Examiner* — Dao H Nguyen
(74) *Attorney, Agent, or Firm* — Seed Intellectual Property Law Group LLP

(57) ABSTRACT

One or more embodiments are directed to system in package (SiP) for optical devices, including proximity sensor packaging. One embodiment is directed to optical sensor that includes a substrate, an image sensor die and a light-emitting device. A first surface of the image sensor die is coupled to the substrate, and a recess is formed extending into the image sensor die from the first surface toward a second surface of the image sensor die. A light transmissive layer is formed in the image sensor die between the recess and the first surface. The optical sensor further includes a light-emitting device that is coupled to the substrate and positioned within the recess formed in the image sensor die.

20 Claims, 6 Drawing Sheets

(51) Int. Cl.
*H01L 31/042* (2014.01)
*H01L 31/046* (2014.01)
*H01L 31/047* (2014.01)
*H01L 31/173* (2006.01)
*H01L 31/0203* (2014.01)
*H01L 31/0236* (2006.01)
*H01L 31/0475* (2014.01)

(56) References Cited

U.S. PATENT DOCUMENTS

| | | | |
|---|---|---|---|
| 9,705,025 B2* | 7/2017 | Tu | H01L 31/167 |
| 9,911,890 B2* | 3/2018 | Renard | H01L 31/173 |
| 2015/0054001 A1* | 2/2015 | Oganesian | H04N 5/2256 |
| | | | 257/82 |
| 2015/0226839 A1* | 8/2015 | Brandl | H01L 25/167 |
| | | | 250/221 |
| 2016/0306042 A1* | 10/2016 | Schrank | G01S 17/026 |

* cited by examiner

OPTICAL SENSOR PACKAGE INCLUDING A CAVITY FORMED IN AN IMAGE SENSOR DIE

BACKGROUND

Technical Field

Embodiments of the present disclosure are directed to optical sensor packages.

Description of the Related Art

Optical sensors, such as proximity sensors, are used to detect the presence of nearby objects and are able to do so without physically touching the object. Some types of optical sensors, such as utilized in optical ranging devices or time of flight sensors, may be used to determine the actual distance to such nearby objects. Optical sensors may be utilized in various electronic devices, such as cameras, phones, including smartphones, vehicles, machinery, and other devices for detecting the presence of and/or distance to nearby objects. After detecting the presence of the nearby object, the electronic device may be configured to perform a function, such as move a mechanical feature to a secure position, transmit an alarm signal, couple or uncouple an electrical communication, or any other desired function.

Optical sensor packages typically include a light-emitting device (e.g., a LED), a light-receiving sensor, such as a photodiode, and a processing chip for processing signals received from the light-receiving sensor. The LED, photodiode and processing chip are typically formed on separate dies and packaged together in a sensor package. Generally described, the LED emits radiation out a first opening in the sensor package. When an object is close to the sensor package, a suitable amount of the emitted radiation is reflected off of the object and back toward the sensor package. Some of the reflected radiation enters a second opening in the sensor package proximate the light-receiving sensor or photodiode. The photodiode receives the reflected radiation and generates an electrical signal indicative of the received radiation, which is transmitted to the processing chip for processing, e.g., to determine the presence of and/or distance to the proximate object.

The light-emitting device and light-receiving and processing devices in conventional optical sensor packages typically provided in a side-by-side configuration, which results in a product having a wide footprint (i.e., x and y dimensions), or in a chip-on-chip or stacked chip configuration, which results in a product having a thick package (i.e., z dimension).

BRIEF SUMMARY

One or more embodiments are directed to a system in package (SiP) for optical sensor devices, such as proximity sensor packages. One embodiment is directed to a package that includes an image sensor die made of silicon, which may also integrate an Application Specific Integrated Circuit (ASIC), having a recess at a surface thereon. A light-emitting device is attached to a substrate. The image sensor die is attached to the substrate such that the recess of the image sensor die forms a cavity with the substrate. The light-emitting device is positioned within the cavity. The recess in the image sensor die is formed to create a thin transparent or light-diffraction layer in the die itself, which is positioned above the light-emitting device and configured to receive and transmit and/or diffract (or otherwise alter) light emitted by the light-emitting device. In particular, the silicon of the image sensor die is suitably transparent to allow light, such as infrared (IR) light, emitted from the light-emitting device to pass therethrough. In one embodiment, a cap is located over the image sensor die to form an upper cavity. The cap may include a first transparent layer facing the image sensor die, for receiving and transmitting light from the light-emitting device, and a second transparent layer positioned facing a light-receiving surface (e.g., an image sensor) of the image sensor die.

DETAILED DESCRIPTION

Embodiments are directed to optical sensor packages, such as a system in package (SiP), for optical devices, including proximity sensors and time of flight sensors. The optical sensor packages may include a light-emitting device, and a receiving device (e.g., an image sensor die) for receiving light emitted from the light-emitting device and reflected by an object toward the receiving device. The receiving device includes receiving circuitry for processing the received light. In that regard, the optical sensor package is capable of emitting an optical signal, receiving an optical signal and analyzing electrical signals.

Figure 1A:
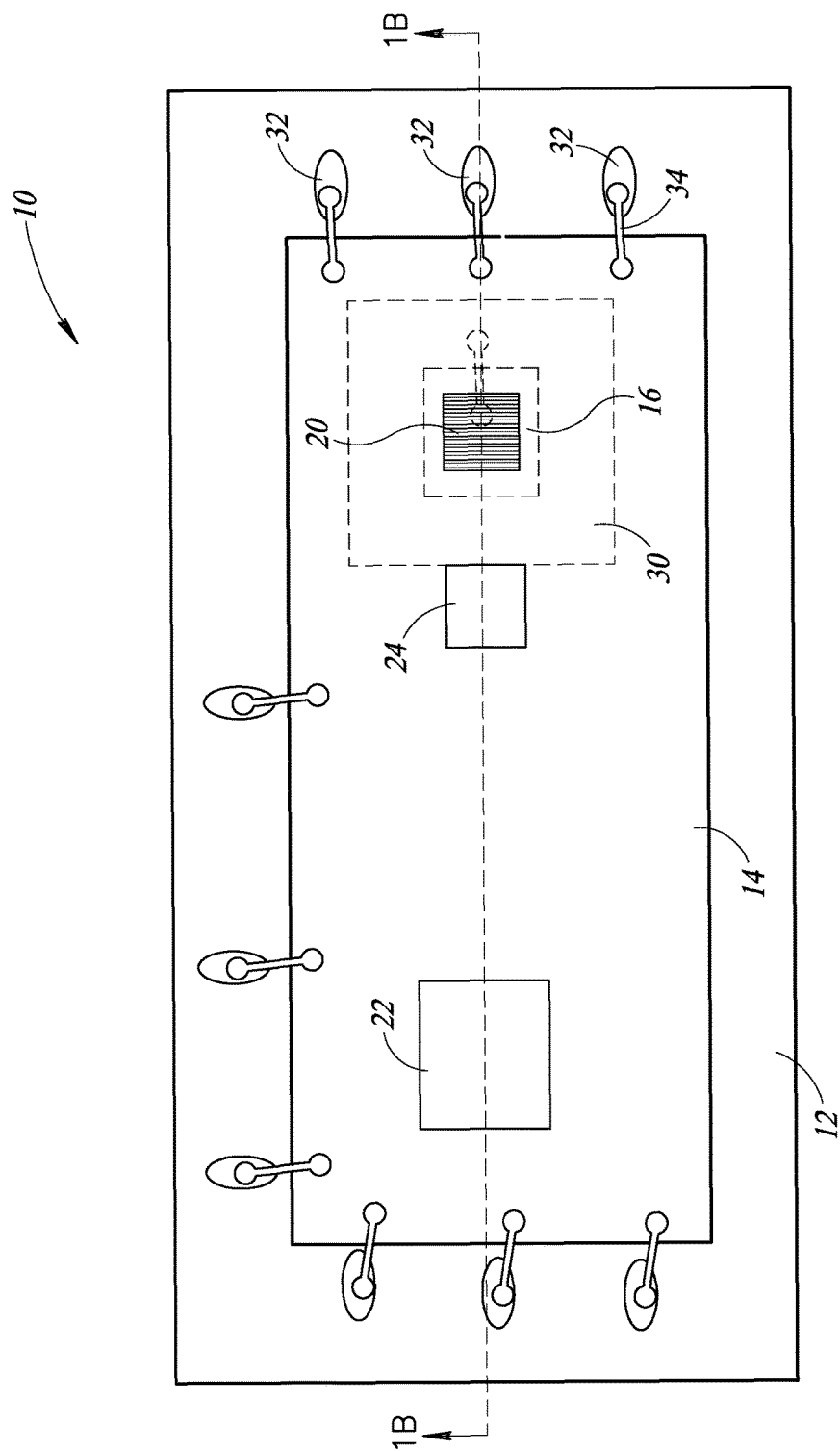
FIG. 1A is a top view of an optical sensor package without a cap, in accordance with an embodiment of the present disclosure.
Figure 1B:
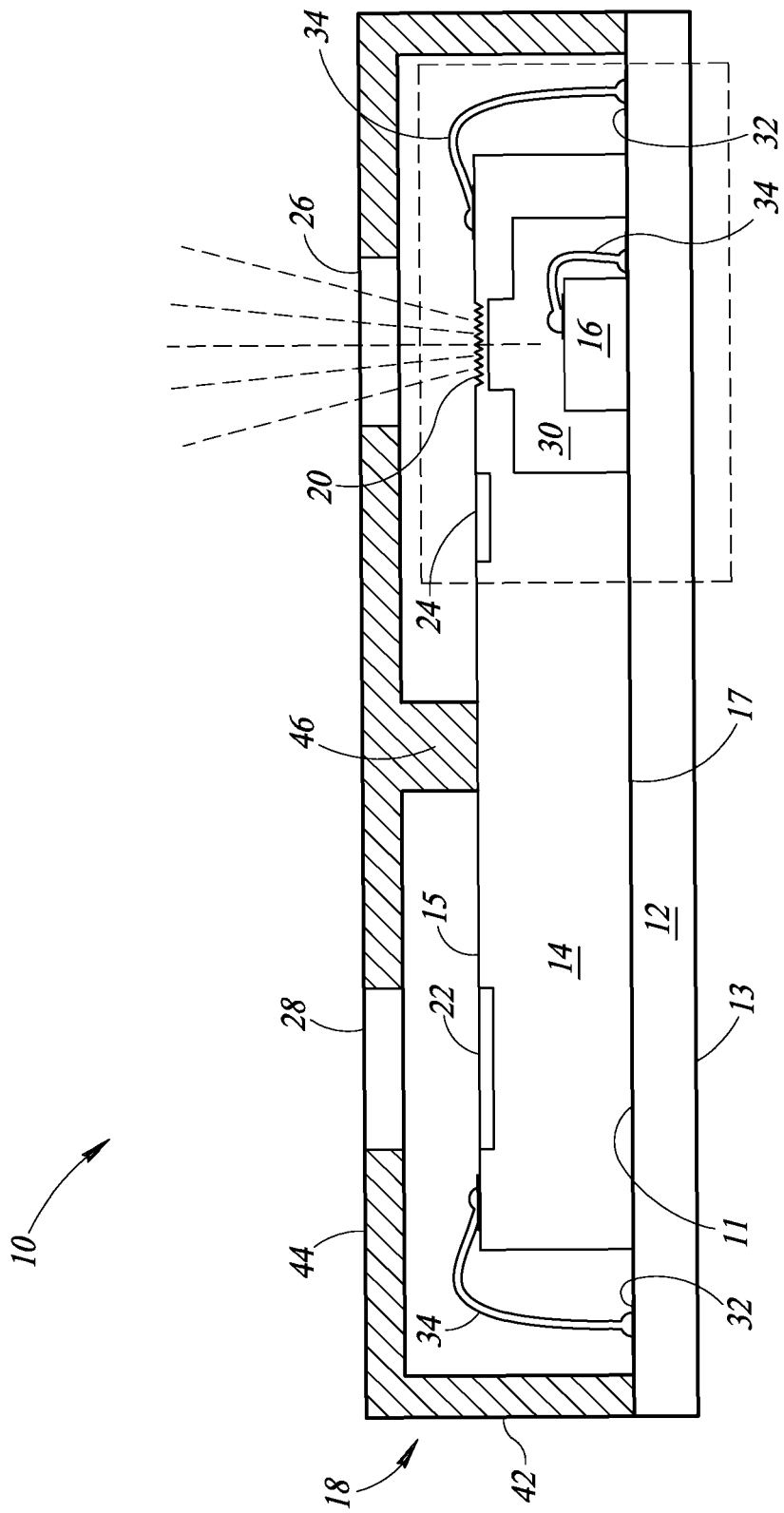
FIG. 1B is a cross-section view of the optical sensor package in FIG. 1A including a cap.
Figure 1C:
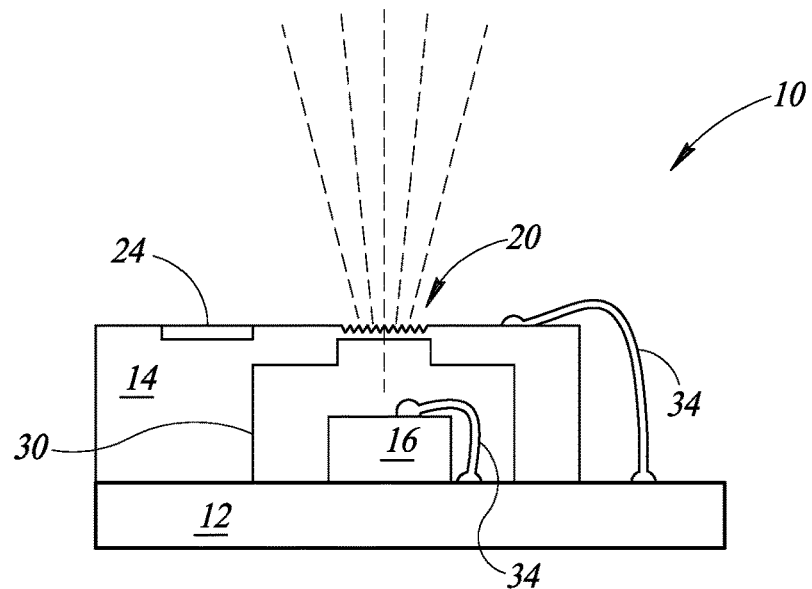
FIGS. 1C is a close-up cross-section view of the dashed rectangular portion of the optical sensor package of FIG. 1B.

FIG. 1A is a top view of an optical sensor package 10 according to one or more embodiments of the present disclosure. FIGS. 1B-1C are cross-section views of the optical sensor package 10. As best shown in FIG. 1B, the optical sensor package 10 may include a substrate 12, an image sensor die 14, a light-emitting device 16, and a cap 18.

Generally described, the substrate 12 includes one or more insulative and conductive layers. A first surface 11 of the substrate 12 includes conductive pads 32 and a second surface 13 of the substrate includes conductive pads or lands (not shown). The pads on the first surface 11 are in electrical communication with one or more lands on the second surface 13 by conductive traces and/or vias formed in the substrate 12. The second surface 13 of the substrate 12 forms an outer surface of the optical sensor package 10 and the lands on the second surface 13 electrically couple the optical sensor package 10 to another device or board (not shown). The insulative material isolates various portions of the conductive features therein.

The image sensor die 14 is secured to the first surface 11 of the substrate 12, such as by an adhesive material. The adhesive material may be any material suitable for securing the image sensor die 14 to the substrate 12, such as tape, paste, glue, or any other suitable material.

The image sensor die 14 is made from a semiconductor material, such as silicon, and includes a first surface 15 and a second surface 17. The image sensor die 14 includes an active surface that includes one or more electrical components, such as integrated circuits. The integrated circuits may be analog or digital circuits implemented as active devices, passive devices, conductive layers, and dielectric layers formed within the die and electrically interconnected according to the electrical design and function of the die. In particular, the image sensor die 14 includes electrical components that form an Application Specific Integrated Circuit (ASIC). Thus, the image sensor die 14 includes circuitry to send, receive, and analyze electrical signals as is well known in the art. In the illustrated embodiment, the active surface is at the first surface 15 of the image sensor die 14.

The image sensor die 14 includes a recess in the second surface 17 of the image sensor die 14 that extends toward the first surface 15 of the image sensor die 14. The recess in the second surface 17 and the first surface 11 of the substrate form a cavity 30 when the image sensor die 14 is secured to the substrate 14.

The light-emitting device 16 is secured to the first surface 11 of the substrate 12 and positioned within the cavity 30. The light-emitting device 16 may be secured to the first surface 11 of the substrate 12 by an adhesive material discussed above and may be the same or different from the adhesive used to secure the light-emitting device 16 to the substrate 12.

The light-emitting device 16 is configured to emit radiation at a particular frequency or frequency range. In one embodiment, the light-emitting device 16 emits infrared (IR) radiation. The light-emitting device 16 may be a vertical cavity surface emitting laser (VCSEL) or a light-emitting diode (LED), e.g., an infrared LED.

The light-emitting device 16 is electrically coupled to the image sensor die 14 (e.g., directly electrically coupled to the image sensor die 14 and/or indirectly coupled to the image sensor die 14 through the substrate 12) and configured to receive electrical signals, such as a power signal from the image sensor die 14, and in response to receiving the signal, to emit the radiation at a particular frequency or frequency range. In particular, the image sensor die 14 is electrically coupled to the substrate 12 by conductive connectors, which in the illustrated embodiment are conductive wires 34. In that regard, a first end of a conductive wire 34 is coupled to the pad on the image sensor die 14 and a second end of the conductive wire 34 is coupled to a pad on the first surface 11 of the substrate 12. Similarly, the light-emitting device 16 is electrically coupled to the first surface 11 of the substrate 12 by one or more conductive wires 34. For example, a first end of a conductive wire 34 may be coupled to a pad on the light-emitting device 16 and a second end of the conductive wire 34 may be coupled to a pad on the first surface 11 of the substrate 12. The light-emitting device 16 may be in electrical communication with the image sensor die 14 through the substrate 12.

In one or more embodiments, the substrate 12 of the optical sensor package 10 may be replaced with a leadframe, as is well-known in the art. For instance, the leadframe may include one or more die pads for supporting the image sensor die 14 and the light-emitting device 16. Furthermore, the leadframe includes a plurality of leads for coupling to the conductive wires 34.

In another embodiment, the conductive connectors are conductive bumps such that the image sensor die 14 and/or light-emitting device 16 are coupled to the substrate 12 by flip chip configuration as is well known in the art.

The image sensor die 14 further includes a light transmissive layer 20, over the cavity 30. The light transmissive layer 20 is formed in the image sensor die 14 at the recess. In particular, the light transmissive layer 20 includes a thin strip of the semiconductor material, such as silicon, making up the image sensor die 14, which may form a stepped recess, such as is shown in the illustrated embodiment. The silicon of the image sensor die 14 is at least partially light transmissive, thereby allowing light emitted from the light-emitting device 16 to pass therethrough. The thickness and the pattern of the light transmissive layer 20 may be adjusted to affect the light being emitted therethrough. In particular, the light transmissive layer 20 may have a thickness suitable to achieve the light transmissivity properties as may be desired. It is well-known that the light transmission properties of an optical material depends, in part, on the thickness of the material, as well as the wavelength of transmitted light, and other well-known factors. In one or more embodiments where the light-emitting device 16 emits radiation in the infrared (IR) range, the light transmissive layer 20 may be made of silicon having a thickness in the range of about 0.1 μm to 100 μm.

An image sensor 22 is formed in or otherwise coupled to the first surface 15 of the image sensor die 14. The light-emitting device 16 may emit radiation in response to an electrical signal received from the image sensor die 14, and the image sensor 22 may receive the reflected radiation and provide electrical signals to the image sensor die 12 for processing.

The cap 18 has sidewalls 42, a cover 44, and an inner wall 46. FIG. 1A illustrates a top down view of the optical sensor package 10 without the cap 18, while FIG. 1B illustrates a cross-section view of the optical sensor package 10 with the cap 18. The sidewalls 42 of the cap 18 are secured to the first surface 11 of the substrate 12 to form the upper cavity, and the inner wall 46 of the cap 18 is secured to the first surface 15 of the image sensor die 14 that separates the upper cavity into separate portions. The cap 18 may be secured by an adhesive material, which may be any adhesive material and may be different from or the same as those described above.

The cover 44 of the cap 18 includes a first transparent region 26, positioned above the light-emitting device 16 and the light transmissive layer 20 of the image sensor die 14, to allow radiation emitted from the light-emitting device 16 to exit the optical sensor package 10. The cover 44 of the cap 18 further includes a second transparent region 28, positioned above the image sensor 22, to allow reflected radiation to enter the optical sensor package 10 and be received by the image sensor 22. The first and second transparent regions 26, 28 may be formed of any transparent material, including, for example, glass. In one or more embodiments, the first and second transparent regions 26, 28 are openings in the cap 18. The first and second transparent regions 26, 28 may include one or more optical filters for filtering the light that passes therethrough.

The inner wall 46 of the cap 18 forms a light barrier between the light-emitting device 16 and the image sensor 22. That is, the inner wall 46 of the cap 18 prevents light emitted from the light-emitting device 16 from being received by the image sensor 22 through the inner wall 46. Instead, the image sensor 22 is optically isolated by the cap 18, except for light that is received through the second transparent region 28.

In one or more embodiments, the cap 18 may be replaced, for example, by clear or transparent molding over the light transmissive layer 20 and image sensor 22, and an opaque molding surrounding the image sensor die 14. In such a case, the clear molding defines first and second light openings through which light emitted by the light-emitting device 16, and light reflected from an object toward the image sensor 22, may pass through.

The optical sensor package 10 may further include a reference sensor 24. The reference sensor 24 may be formed in or otherwise coupled to the first surface 15 of the image sensor die 14. The reference sensor 24 is positioned near the light-emitting device 16 and configured to receive a reference light emission, for example, light emitted by the light-emitting device 16 and reflected from a nearby surface having a known distance or optical path length, such as an inner surface of the inner wall 46 of the cap 18, back to the reference sensor 24. A reference sensor circuit (not shown) is formed in the image sensor die 14 in the vicinity of the reference sensor 24 so as to process a signal generated by the reference sensor 24 upon receiving the reflected reference light. The image sensor die 14 may thus include circuitry to send, receive, and analyze electrical signals received from the image sensor 22 as well as the reference sensor 24, as is well known in the art.

In operation, the ASIC of the image sensor die 14 is configured to cause the light-emitting device 16 to emit light through the first transparent region 26. The light is reflected by a nearby object and travels through the second transparent region 28 and the image sensor 22 receives the light. The ASIC of the image sensor die 14 receives the signals from the image sensor 22 and is configured to process signals generated by the image sensor 22 upon receiving the reflected light.

In the illustrated embodiment, the light-emitting device 16 is located on the substrate 12 within the cavity 30. Accordingly, the footprint (e.g., x and y dimensions) and/or the profile or thickness (e.g., z dimension) of the optical sensor package 10 may be reduced in comparison to known optical sensor packages, which typically include a light-emitting device positioned next to, or stacked on top of, the image sensor die. That is, the footprint and profile of the optical sensor package 10 are defined by the footprint and profile of the image sensor die 14, as the light-emitting device 16 fits entirely within the cavity 30 formed in the image sensor die 14.

FIG. 1C is a cross-section view showing a portion of the optical sensor package (e.g., as shown within the dashed lines) of FIG. 1B. At least a portion of the light transmissive layer 20 is patterned. For example, the light transmissive layer 20 may be patterned to form a diffraction layer for diffracting the light emitted by the light-emitting device 16, as shown in FIG. 1C. The light transmissive layer 20 may be formed and/or patterned using any known semiconductor processing techniques, including, for example, a photoresist and dry etching process, deposition of a dielectric layer, nano-imprinting or the like. Further, the light transmissive layer 20 may be formed and/or patterned to have optical characteristics as desired, including, for example, refractive index, polarization, diffraction or the like. The patterned portion of the light transmissive layer 20 may be formed directly within the image sensor die 14 of silicon or may include an additional layer formed over the thin strip of image sensor die 14 remaining after forming the recess 30.

Figure 1D:
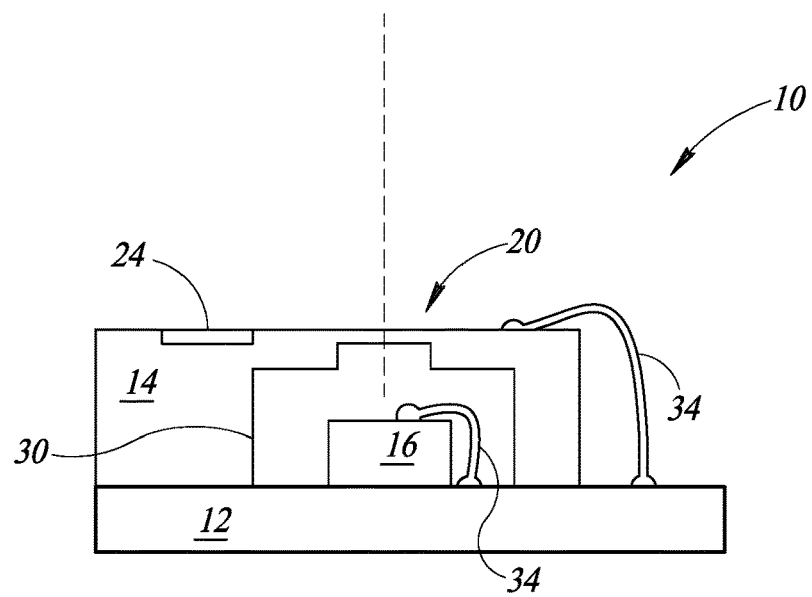
FIG. 1D is a close-up cross-section view of an optical sensor package in accordance with another embodiment.

FIG. 1D is a cross-section view of the dashed lines portion of the optical sensor package 10 of FIG. 1B in accordance with another embodiment. The optical sensor package is the same in structure and function the to the optical package of FIGS. 1A-1C except that the light transmissive layer 20 is not patterned, thereby providing a transmissive layer that does not diffract the light transmitted therethrough.

In one or more embodiments, the light transmissive layer 20 may be an active layer, in which one or more optical characteristics may be dynamically varied and/or controlled. For example, the silicon or portions thereof of the light transmissive layer 20 may be doped. In that regard, a voltage or other control signal may be applied to doped regions of the light transmissive layer 20, which causes a change in one or more optical characteristics (e.g., refractive index, polarization, diffraction or the like) of the light transmissive layer 20. This can be seen, for example, in FIGS. 1C and 1D, in which the light transmissive layer 20 is changed (e.g., by one or more signals received from the image sensor die 14) from a light diffracting layer (FIG. 1C) into a non-diffracting layer (FIG. 1D).

Figure 2A:
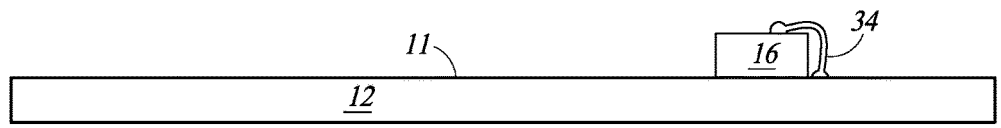
FIGS. 2A through 2C are cross-section views illustrating a method of forming the optical sensor package shown in FIGS. 1A-1D, in accordance with embodiments of the present disclosure.
Figure 2B:
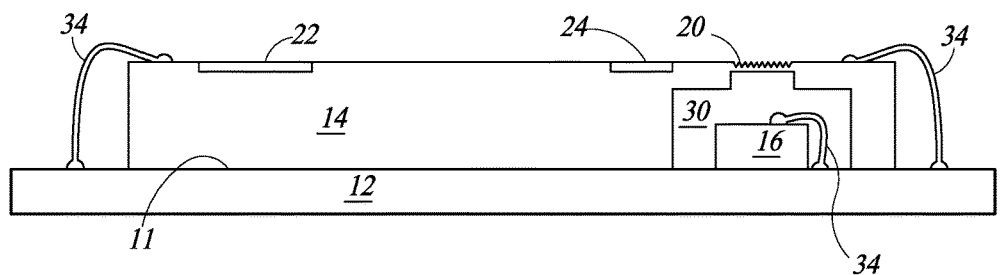
Figure 2C:
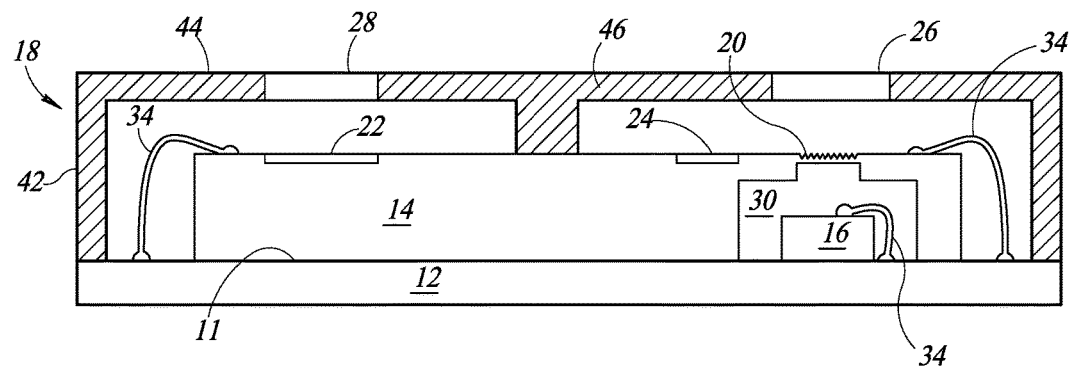

FIGS. 2A-2C illustrate a method of making the optical sensor package 10 of FIGS. 1A-1D according to one embodiment. As shown in FIG. 2A a light-emitting device 16 is attached to the first surface 11 of the substrate 12. The light-emitting device 16 may be attached to the substrate 12 using an adhesive material, such as tape, paste, glue, or any other suitable adhesive material. The light-emitting device 16 is electrically coupled to the first surface 11 of the substrate 12. In the illustrated embodiment, electrical coupling is completed by coupling a first end of a conductive wire 34 to a pad of the substrate 12. It is to be appreciated that electrical coupling and mechanical coupling may alternatively be provided in one or more embodiments by a flip chip process, for example, by reflowing solder balls between the surface of the light-emitting device 16 and pads of the first surface 11 of the substrate 12.

As shown in FIG. 2B an image sensor die 14 including a recess and a light transmissive layer 20 is formed. The image sensor die 14 is formed of silicon. The recess may be formed, for example, using standard front-end semiconductor processing techniques, such as at wafer level. For instance, the light transmissive layer 20 may be formed and/or patterned using photoresist and dry and/or wet etching processing, deposition of a dielectric layer, nano-imprinting or the like. In the illustrated embodiment, the recess is a step recess, such that a first recess is provided for accommodating the light-emitting device 16 and the second recess forms the light transmissive layer 20. In that regard, the forming of the stepped recess may include two separate patterning and etching steps.

The light transmissive layer 20 may be a passive or an active layer, and thus may be doped. The shape of the transmissive layer may be determined based on the desired optical characteristics, including, for example, refractive index, polarization, diffraction or the like. That is, the upper surface of the transmissive layer may be patterned in such a way to cause the light received from light-emitting device 16 to have desired optical characteristics. The image sensor die 14 may further include an image sensor 22 and a reference sensor 24.

The image sensor die 14 is attached to the first surface 11 of the substrate 12 using an adhesive material, with the cavity 30 and the light transmissive layer 20 being positioned above the light-emitting device 16. The image sensor die 14 is electrically coupled to the first surface 14 of the substrate 12. In the illustrated embodiment, electrical coupling is completed by coupling a first end of a conductive wire 34 to a pad of the image sensor die 14 and a second end of the conductive wire 34 to a pad 32 of the substrate 12. It is to be appreciated that electrical coupling and mechanical coupling may alternatively be provided in one or more embodiments, for example, by reflowing solder balls between the surface of the image sensor die 14 and pads of the first surface 11 of the substrate 12.

As shown in FIG. 2C, the cap 18 is secured to the first surface 11 of the substrate 12, with the sidewalls 42 positioned outward of the image sensor die 14 and the conductive wires 34. The inner wall 46 of the cap 18 is secured to the first surface 15 of the image sensor die 14. The first and second transparent regions 26, 28 may be formed in the cap 18 prior to securing the cap 18 to the substrate 12 (e.g., where the first and second transparent regions 26, 28 include, for example, glass). Alternatively, the first and second transparent regions 26, 28 may be openings formed in the cap 18, for example, after securing the cap 18 to the substrate 12.

Figure 3:
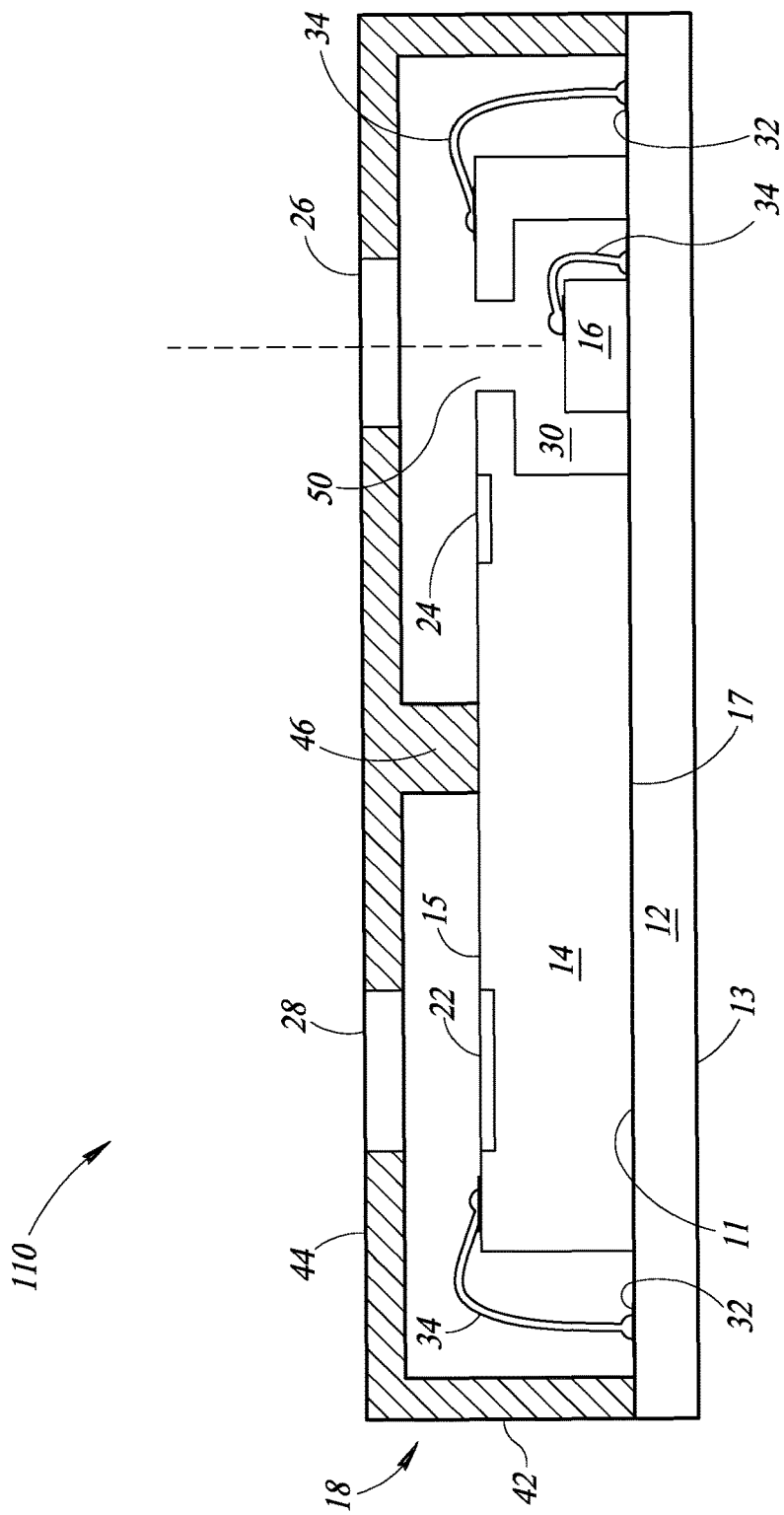
FIG. 3 is a cross-section view of an optical sensor package in accordance with another embodiment of the present disclosure.

FIG. 3 shows a cross-section view of an optical sensor package 110 according to another exemplary embodiment of the present disclosure. The optical sensor package 110 of FIG. 3 is similar in structure and function to the optical sensor package 10 of FIGS. 1A-1D except for the difference that will be discussed below. The features shared by the optical sensor packages 10 and 110 will not be described here again in the interest of brevity.

The difference between the optical sensor package 110 shown in FIG. 3 and the optical sensor package 10 shown in FIGS. 1A-1D is that the light transmissive layer 20 is not present in the optical sensor package 110. Instead, the optical sensor package 110 of FIG. 3 includes a through opening 50 in the image sensor die 14 over the cavity 30. Thus, the cavity 30 is in fluid communication with a cavity formed by the cap 18 and the outer surface of the image sensor die 14. During operation, the light-emitting device 16 emits light through the opening 50 and the first transparent region 26.

One or more embodiments provide for a system in package. In that regard, the footprint of the system on a board is smaller than when two separate packages are used, one or more packages for the optical dice (e.g., a light-emitting device and a light-receiving device, such as an image sensor) and another package for the processor die.

Figure 4:
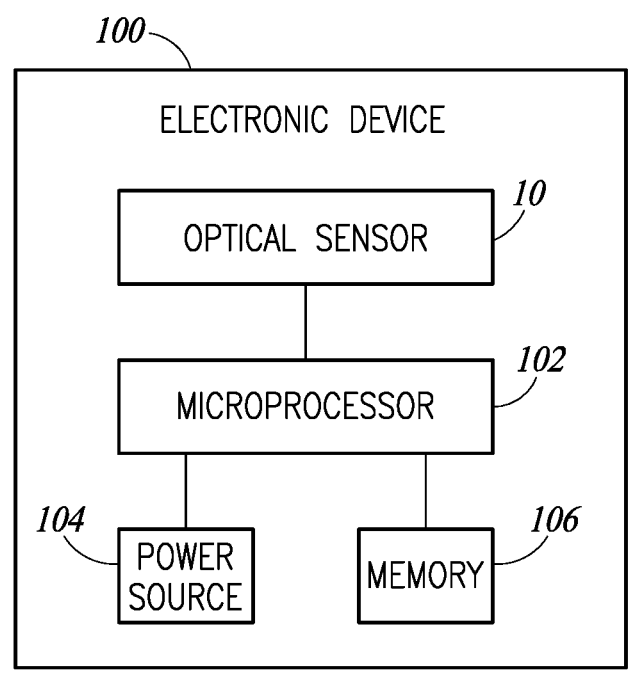
FIG. 4 is a block diagram illustrating an electronic device including an optical sensor package, in accordance with embodiments of the present disclosure.

FIG. 4 shows an electronic device 100 including an optical sensor package described herein, such as the optical sensor package 10 or the optical sensor package 110, coupled to a microprocessor 102. The microprocessor 102 may be any circuit configured to receive or send electrical signals to the optical sensor package 10 or 110. The electronic device 100 may further include a power source 104 configured to provide electric power for the device. The power source 104, which may be a battery, may be coupled to the microprocessor 102. The electric device 100 may also include a memory 106 coupled to or incorporated in the microprocessor 102.

In one or more embodiments, the electronic device 100 may be a cell phone, smartphone, tablet, camera, and/or wearable computing device that may be located in clothing, shoes, watches, glasses or any other wearable structures. In some embodiments, the electronic device 100, or the optical sensor package 10 itself, may be located in a vehicle, such as boat and car, a robot, or any other moveable structure or machinery.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An optical sensor package, comprising:
   a substrate having a surface;
   an image sensor die coupled to the substrate, the image sensor die comprising a semiconductor material and including:
   a first surface directly attached to the surface of the substrate,
   a second surface,
   an image sensor at the second surface, and
   a through opening that extends through the first surface and the second surface; and
   a light-emitting device directly attached to the surface of the substrate and positioned within the through opening.

2. The optical sensor package of claim 1 wherein the light-emitting device comprises at least one of a vertical cavity surface emitting laser (VCSEL) and a light-emitting diode (LED).

3. The optical sensor package of claim 1, further comprising a cap positioned around side surfaces of the image sensor die, the cap having sidewalls and an inner wall, the inner wall optically separating the light-emitting device from an image sensor region of the image sensor die.

4. The optical sensor package of claim 3 wherein the cap covers at least a portion of the second surface of the image sensor die.

5. The optical sensor package of claim 3 wherein the image sensor die includes a reference sensor formed in the second surface and operable to receive light emitted from the light-emitting device and reflected from an inner surface of the cap.

6. The optical sensor package of claim 1, further comprising a molding material that covers the image sensor die.

7. The optical sensor package of claim 6 wherein the molding material includes an opaque molding portion that covers the image sensor die, and a transparent molding portion that covers the through opening.

8. An optical sensor package, comprising:
   a substrate having, a surface;
   an image sensor die coupled to the substrate, the image sensor die comprising a semiconductor material and including:
   a first surface directly attached to the surface of the substrate,
   a second surface,
   an image sensor at the second surface, and
   a recess that extends into the image sensor die from the first surface toward the second surface, the recess forms a cavity with the surface of the substrate;
   a light-emitting device directly attached to the surface of the substrate and positioned within the cavity; and
   a cover that optically separates the light-emitting device from the image sensor.

9. The optical sensor package of claim 8 wherein the image sensor die includes a through opening between the first surface and the recess, the through opening has a width that is smaller than a width of the recess.

10. The optical sensor package of claim 9 wherein the cover is molding that includes an opaque molding that covers the image sensor die, and a transparent molding that covers the through opening.

11. The optical sensor package of claim 9 wherein the image sensor die includes a light transmissive layer formed at the second surface and facing the recess.

12. The optical sensor package of claim 11 wherein the light transmissive layer of the image sensor die includes a light diffraction layer.

13. The optical sensor package of claim 11 wherein the semiconductor material is silicon, and the light transmissive layer is formed from the silicon of the image sensor die.

14. The optical sensor package of claim 11 wherein the light transmissive layer of the image sensor die is an active layer operable to receive a control signal and, in response, to vary one or more optical characteristics of the light transmissive layer.

15. The optical sensor package of claim 14 wherein the one or more optical characteristics includes at least one of diffraction, refractive index and polarization characteristics.

16. The optical sensor package of claim 11 wherein the cover is a cap coupled to the substrate, wherein the cap has an inner wall that optically separates the light-emitting device from the image sensor.

17. A method, comprising:
   electrically and mechanically coupling a light-emitting device directly to a surface of a substrate;
   placing an image sensor die having a through opening over the light-emitting device such that the light-emitting device is positioned in the through opening, the image sensor die including a semiconductor material and having opposite first and second surfaces and an image sensor at the second surface; and
   electrically and mechanically coupling the first surface of the image sensor die directly to the surface of the substrate with the light-emitting device located in the through opening of the image sensor die.

18. The method of claim 17, further comprising:
   positioning a cap over the image sensor die, the cap including sidewalls and an inner wall, the cap having a first transparent region over the light-emitting device and a second transparent region over an image sensor portion of the image sensor die.

19. The method of claim 17, further comprising:
   covering the image sensor die with a molding material.

20. The method of claim 19 wherein covering the image sensor die with the molding material includes:
   covering a first portion of the image sensor die with an opaque molding material; and
   covering a second portion of the image sensor die with a transparent molding material, the second portion including the through opening.

\* \* \* \* \*

UNITED STATES PATENT AND TRADEMARK OFFICE
CERTIFICATE OF CORRECTION

PATENT NO. : 10,347,786 B2
APPLICATION NO. : 15/880090
DATED : July 9, 2019
INVENTOR(S) : Loic Pierre Louis Renard et al.

Page 1 of 1

It is certified that error appears in the above-identified patent and that said Letters Patent is hereby corrected as shown below:

In the Claims

Column 8, Line 45:
"a substrate having, a surface;" should read, --a substrate having a surface;--.

Signed and Sealed this
Twenty-seventh Day of August, 2019

Andrei Iancu
*Director of the United States Patent and Trademark Office*